(12) United States Patent
Park et al.

(10) Patent No.: US 7,391,071 B2
(45) Date of Patent: Jun. 24, 2008

(54) NONVOLATILE MEMORY DEVICES WITH TRENCHED SIDE-WALL TRANSISTORS AND METHOD OF FABRICATING THE SAME

(75) Inventors: Min-Cheol Park, Seoul (KR); Sung-Hoi Hur, Seoul (KR); Jung-Dal Choi, Gyeonggi-do (KR); Ji-Hwon Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 277 days.

(21) Appl. No.: 11/233,857

(22) Filed: Sep. 23, 2005

(65) Prior Publication Data
US 2006/0063331 A1    Mar. 23, 2006

(30) Foreign Application Priority Data
Sep. 23, 2004   (KR) .................. 10-2004-0076496

(51) Int. Cl.
*H01L 29/76* (2006.01)
*H01L 21/336* (2006.01)

(52) U.S. Cl. ................. 257/296; 257/315; 257/321; 438/263; 438/264

(58) Field of Classification Search ............. 438/259, 438/257, 594, 264, 262, 263
See application file for complete search history.

(56) References Cited

U.S. PATENT DOCUMENTS

| 6,222,769 B1 | 4/2001 | Maruyama et al. |
| 2001/0046736 A1 * | 11/2001 | Fu .................. 438/248 |

FOREIGN PATENT DOCUMENTS

| JP | 11-054732 | 2/1999 |
| KR | 10-1997-0081075 | 7/1999 |
| KR | 1020030048957 | 6/2003 |

* cited by examiner

*Primary Examiner*—Kevin M Picardat
(74) *Attorney, Agent, or Firm*—Myers Bigel Sibley & Sajovec, P.A.

(57) ABSTRACT

A nonvolatile memory device includes a semiconductor substrate, a device isolation layer, a tunnel insulation layer, a floating gate, a buried floating gate, and a control gate. A trench is in the substrate that defines an active region of the substrate adjacent to the trench. A device isolation layer is on the substrate along the trench. A tunnel insulation layer is on the active region of the substrate. A floating gate is on the tunnel insulation layer opposite to the active region of the substrate. A buried floating gate is on the device isolation layer in the trench. An intergate dielectric layer is on and extends across the floating gate and the buried floating gate. A control gate is on the intergate dielectric layer and extends across the floating gate and the buried floating gate.

20 Claims, 13 Drawing Sheets

NONVOLATILE MEMORY DEVICES WITH TRENCHED SIDE-WALL TRANSISTORS AND METHOD OF FABRICATING THE SAME

PRIORITY STATEMENT

A nonvolatile storage device is disclosed in U.S. Pat. No. 6,222,769 entitled "NONVOLATILE SEMICONDUCTOR STORAGE DEVICE HAVING BURIED ELECTRODE WITHIN SHALLOW TRENCH", in which a voltage is applied to an electrode buried in a trench to prevent erroneous writing. This nonvolatile storage device will now be described with reference to FIG. 2A and FIG. 2B.

FIELD OF THE INVENTION

The present invention relates to nonvolatile memory devices and, more particularly, to transistors for use in nonvolatile memory devices and methods of making the same.

BACKGROUND OF THE INVENTION

Fabrication of more highly integrated nonvolatile semiconductor memory devices can be made more difficult by a corresponding reduction that can occur in available memory cell current and coupling ratio of the memory cell structures as their integration density is increased. Reduction of memory cell current can become particularly severe in NAND type nonvolatile memory devices in which a plurality of memory cells are connected in series. As illustrated in FIG. 1, a NAND type nonvolatile memory device includes a select transistor and a plurality of memory cells that are connected in series. Gate electrodes of the memory cell are connected to a word line WL. Gate electrodes of the select transistor are connected to either a ground select line GSL or a string select line SSL. A plurality of strings of series connected memory cells are connected to a common source line CSL. Each string of series connected memory cells are connected to a different bit line BL.

To perform a write operation to a selected memory cell "A", a program voltage is applied to a gate electrode of the memory cell "A" and a voltage of 0V is applied to a channel of the memory cell "A", which results in FN tunneling. Through FN tunneling, a logical value of "0" is stored in the selected memory cell "A" while a channel of an unselected memory cell "B" connected to a selected word line WL is floated. A voltage at least as large as that applied to a corresponding string select line SSL is applied to a selected bit line BL, and a voltage of 0V is applied to an unselected bit line BL. A program voltage is applied to a selected word line WL, and a pass voltage is applied to an unselected word line WL.

In order to prevent an unselected memory cell from being written by applied program voltages and pass voltages, a channel of an unselected memory cell connected to a selected word line WL must be floated and boosted to a predetermined voltage. However, the channel voltage of an unselected memory cell may not be sufficiently boosted due to variation in a threshold voltage of the unselected memory cell and/or the select transistor coupled to the unselected memory cell. Variation of the threshold voltage may be caused by, for example, variation in the coupling ratio and available channel voltage of the unselected memory cell and/or the select transistor. Consequently, the program and pass voltages can be constrained below a level that is sufficient for some programming speeds.

To perform a read operation, a voltage of 0V is applied to a selected word line WL and a pass voltage is applied to an unselected word line WL. A current flowing on a selected bit line BL is measured to sense data stored in the selected memory cell as a logical value of '0' or '1'. Reading of data on the selected BL line can be facilitated by a larger sensed change in the current from the selected memory cell. However, the current that can flow through the series connected selected and unselected cells decreases with a reduction in size of the cells, which can limit higher integration of the memory device.

A nonvolatile storage device is disclosed in U.S. Pat. No. 6,222,796 entitled "NONVOLATILE SEMICONDUCTOR STORAGE DEVICE HAVING BURIED ELECTRODE WITHIN SHALLOW TRENCH", in which a voltage is applied to an electrode buried in a trench to prevent erroneous writing. This nonvolatile storage device will now be described with reference to FIG. 2A and FIG. 2B.

As illustrated in FIG. 2A and FIG. 2B, an insulation layer 16 is in a lower portion of a shallow trench 14 in a substrate 11. A buried electrode 18 is on the insulation layer 16. A floating gate 17 is formed on an active region between the shallow trenches 14. An intergate dielectric 20 is on the floating gate 17 and the buried electrode 18. A control gate electrode 21 is on the intergate dielectric 20 and crosses over the floating gate 17 and the buried electrode 18. The buried electrode 18 extends parallel to and partially within the shallow trench 14. In the illustrated storage device, during a write operation a high-level voltage is applied to the buried electrode 18 of a memory cell that is connected to an unselect bit line to avoid writing. A thick insulation layer 19 is between the buried electrode 18 and the control gate electrode 21 to insulate the buried electrode 18 from the control gate electrode 21.

With reference to FIG. 2A, forming the buried electrodes 18 in such memory cells and providing the necessary voltages thereto can be difficult. The memory device includes source contacts 42 and bit line contacts 43 formed in an active region 41. The source contacts 42 are configured to conduct a voltage to a source region of the memory cells. The bit line contacts 43 are electrically coupled to bit lines BL. The storage device uses polysilicon contacts 44 to apply a voltage to a buried electrode 18. The regions that are used to form these various contacts can increase the area used by the cell arrays, and a peripheral circuitry is needed to supply the various voltages through the contacts further increases the area of the memory device.

SUMMARY OF THE INVENTION

In some embodiments of the present invention, a nonvolatile memory device includes a semiconductor substrate, a device isolation layer, a tunnel insulation layer, a floating gate, a buried floating gate, and a control gate. A trench is in the substrate that defines an active region of the substrate adjacent to the trench. A device isolation layer is on the substrate along the trench. A tunnel insulation layer is on the active region of the substrate. A floating gate is on the tunnel insulation layer opposite to the active region of the substrate. A buried floating gate is on the device isolation layer in the trench. An intergate dielectric layer is on and extends across the floating gate and the buried floating gate. A control gate is on the intergate dielectric layer and extends across the floating gate and the buried floating gate.

In some further embodiments, a lower major surface of the floating gate can be above an upper major surface of the buried floating gate. The upper major surface of the buried floating gate can be aligned with an upper major surface of the active region of the substrate. A buried gate insulation layer can be between the buried floating gate and a sidewall of the substrate along the trench. The buried gate insulation layer can be thicker than the tunnel insulation layer.

In some further embodiments, a central region of the device isolation layer in the trench has an upper major surface that is recessed below an upper major surface of a surrounding region of the device isolation layer in the trench. The buried floating gate is disposed in the recessed central region of device isolation layer so that the surrounding region of the device isolation layer is between the buried floating gate and a sidewall of the semiconductor in the trench.

In some other embodiments, a nonvolatile memory device includes a semiconductor substrate, a plurality of trenches in the substrate, a tunnel insulation layer, a plurality of floating gates, a buried gate insulation layer, a plurality of buried floating gates, an intergate dielectric layer, and a control gate. The trenches in the substrate define active regions therebetween. The tunnel insulation layer is on the active regions of the substrate. The plurality of floating gates are each on the tunnel insulation layer over the active regions of the substrate. The buried gate insulation layer is on the substrate along the trenches. The plurality of buried floating gates are each in one of the trenches on the buried gate insulation layer and adjacent to one of the floating gates. The buried gate insulation layer is between the buried floating gates and sidewalls of the trenches. An intergate dielectric layer is one and extends across the floating gates and the buried floating gates. A control gate is on the intergate dielectric layer and extending across the floating gates and the buried floating gates.

Some other embodiments provide a method of fabricating a nonvolatile memory device. A trench is formed in a semiconductor substrate that defines an active region of the substrate adjacent to the trench. A tunnel insulation layer is formed on the active region of the substrate. A floating gate is formed on the tunnel insulation layer opposite to the active region of the substrate. A device isolation layer is formed on the substrate along the trench. A buried floating gate is formed on the device isolation layer in the trench.

BRIEF DESCRIPTION OF THE DRAWINGS

FIG. 4A through FIG. 7A are top plan views of nonvolatile memory devices and methods of making the same in accordance with first embodiments of the present invention.

FIG. 4B through FIG. 7B are cross-sectional views taken along lines I-I' of FIG. 4A through FIG. 7A, respectively.

FIG. 4C through FIG. 7C are cross-sectional views taken along lines II-II' of FIG. 4A through FIG. 7A, respectively.

FIG. 8A through FIG. 9A are top plan views of nonvolatile memory devices and methods of making the same in accordance with second embodiments of the present invention.

DETAILED DESCRIPTION OF EMBODIMENTS OF THE INVENTION

Figure 1:
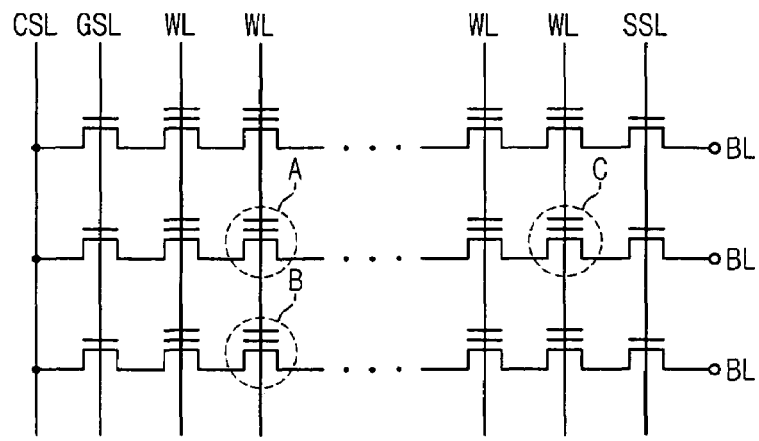
FIG. 1 is a circuit diagram of a conventional NOR type flash memory device.
Figure 2A:
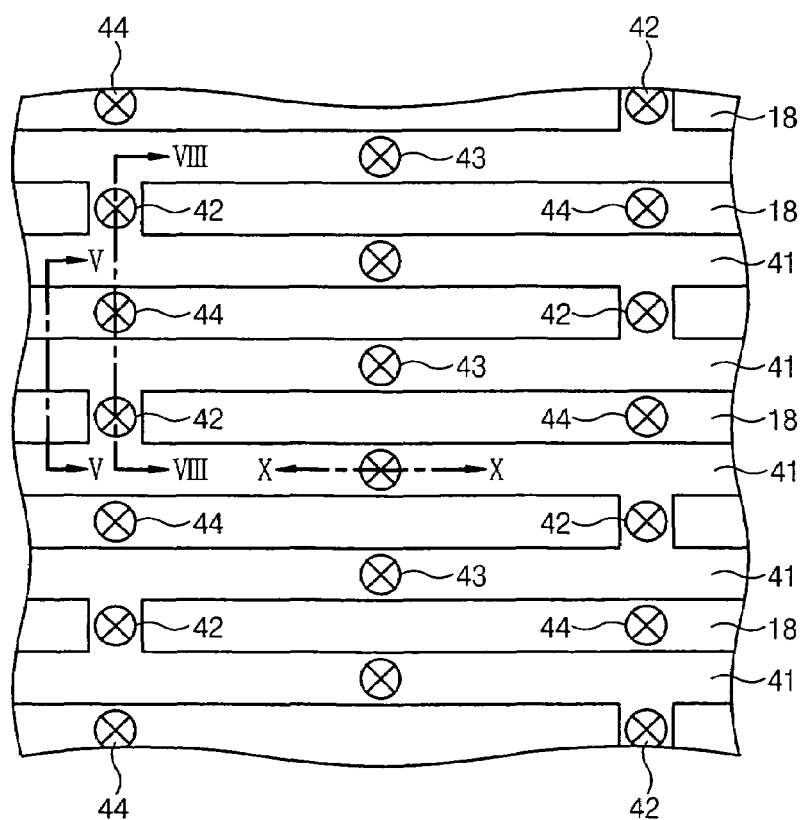
FIG. 2A and FIG. 2B are a top plan view and a cross-sectional view, respectively, of a conventional nonvolatile memory device.
Figure 2B:
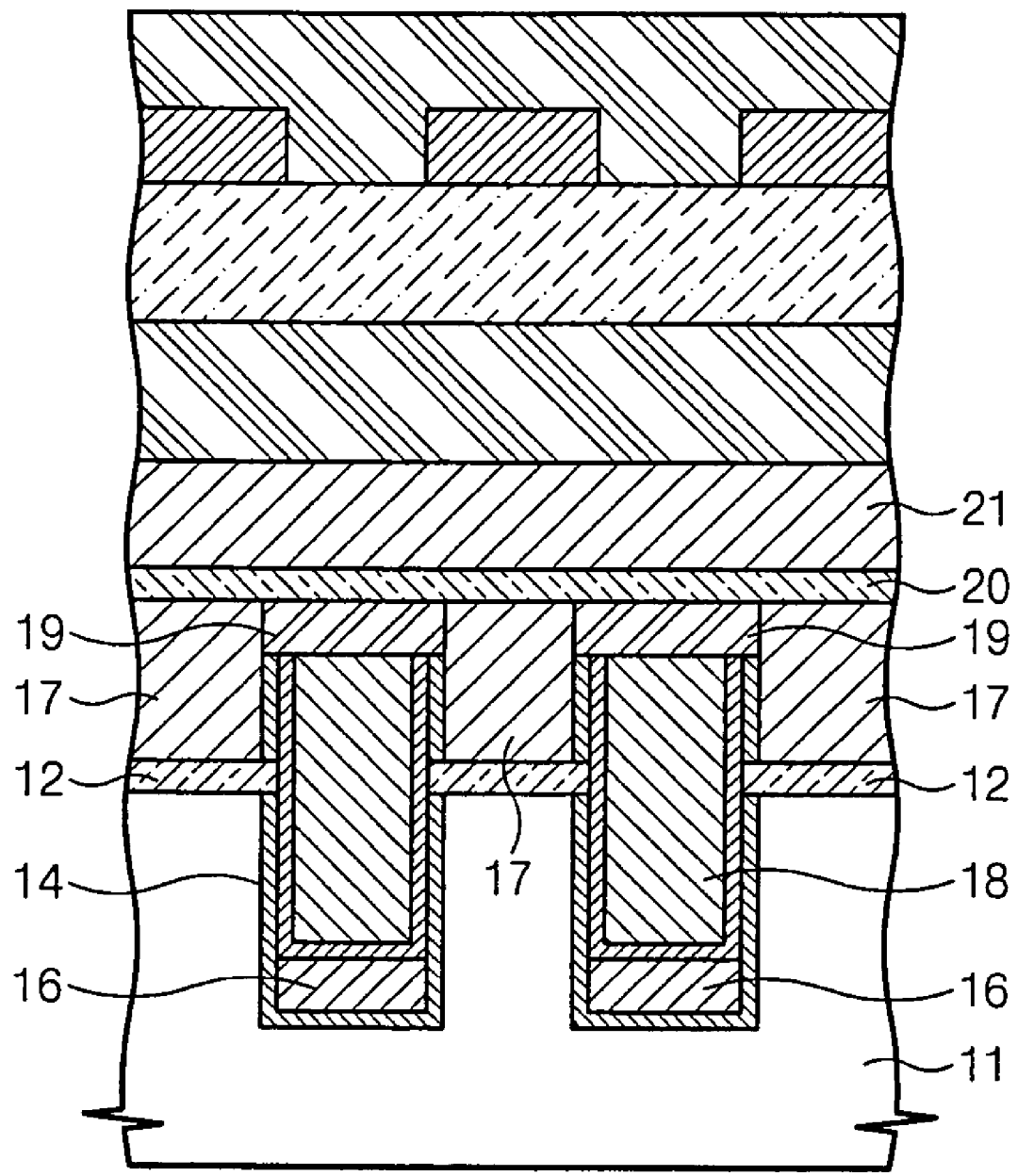

While the invention is susceptible to various modifications and alternative forms, specific embodiments thereof are shown by way of example in the drawings and will be described in detail herein. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top" may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A nonvolatile memory device according to an exemplary embodiment of the present invention will now be described with reference to FIGS. 3A-C.

Figure 3A:
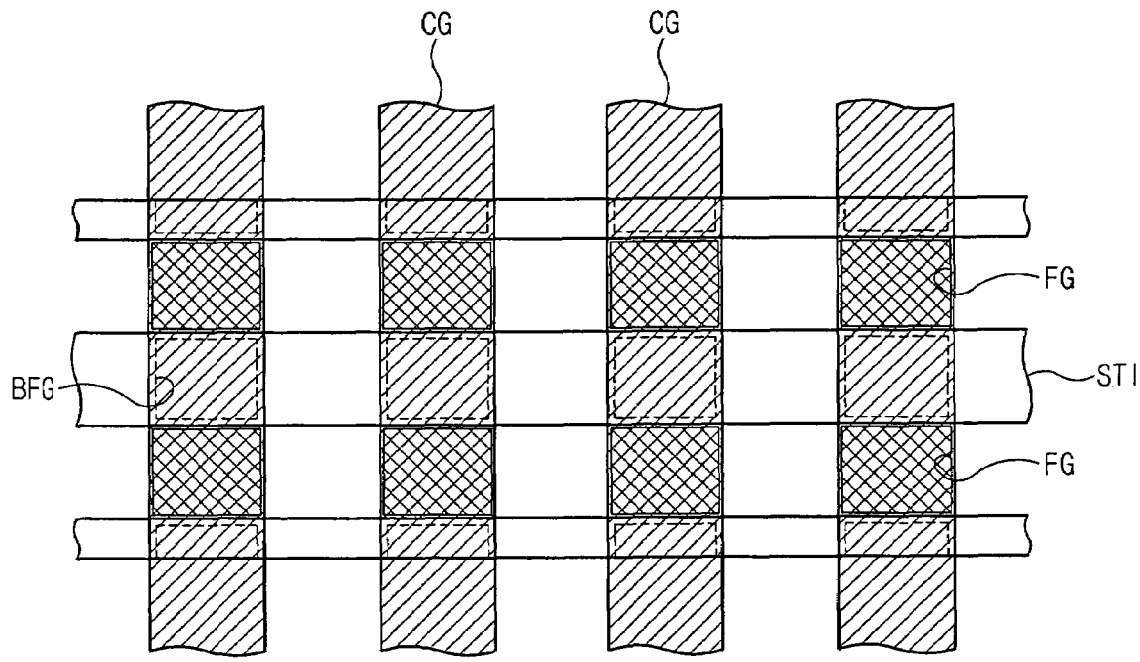
FIG. 3A is a top plan view of a nonvolatile memory device according to an exemplary embodiment of the present invention.
Figure 3B:
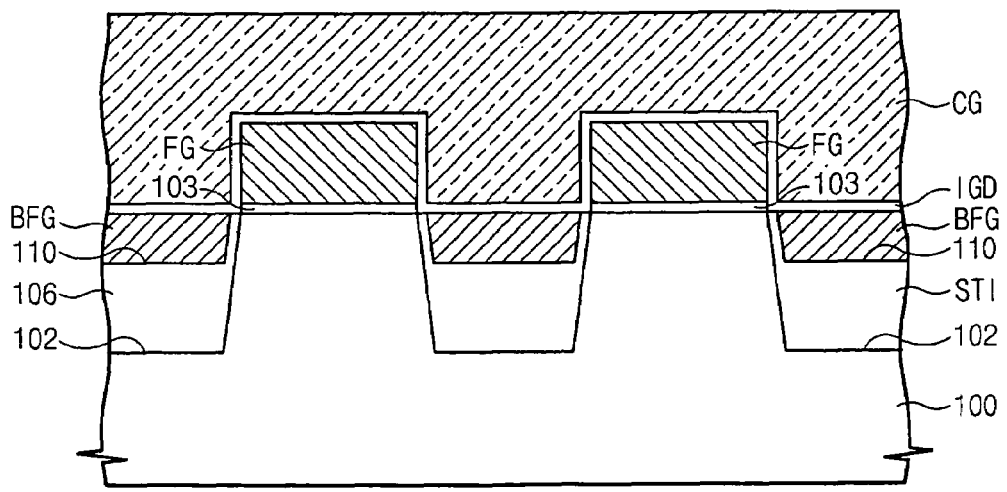
FIG. 3B is a cross-sectional view taken along a line I-I' of FIG. 3A.
Figure 3C:
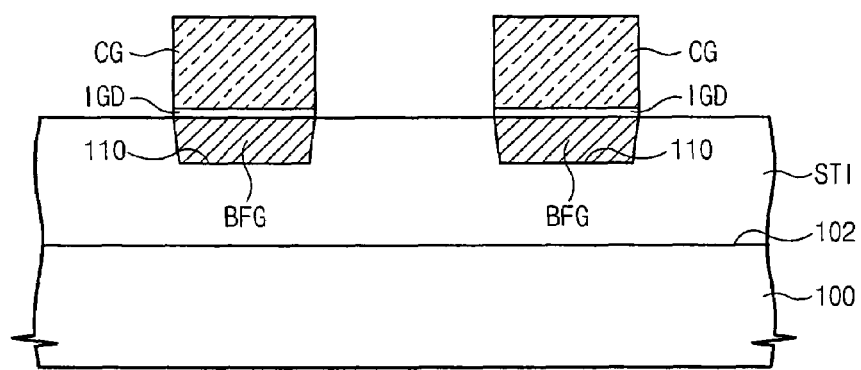
FIG. 3C is a cross-sectional view taken along a line II-II' of FIG. 3A.

As illustrated in FIGS. 3A-C, trenches 102 are formed in a semiconductor substrate 100, and a device isolation layer STI is formed in the trenches 102 to define an active region of the substrate 100 therebetween. A control gate electrode CG and a floating gate FG are on the active region of the substrate 100. A tunnel insulation layer 103 is between the floating gate FG and the active region of the substrate 100. An intergate dielectric IGD is between the floating gate FG and the control gate electrode CG.

A buried floating gate BFG is in the trenches 102 adjacent to the floating gate FG. The buried floating gate BFG is formed in a recessed region 110 of the device isolation layer STI. More particularly, with reference to FIG. 3B, the device isolation layer STI in the trench 102 can have a central region with an upper major surface that is recessed below an upper major surface of a surrounding region of the device isolation layer STI. The buried floating gate BFG can be disposed in the recessed central region of the device isolation layer STI. The surrounding region of the device isolation layer STI can electrically insulate the buried floating gate BFG from sidewalls of the active region of the substrate 100 and, preferably, is sufficiently thick to prevent FN tunneling between the buried floating gate BFG and the active region of the substrate 100 during a write operation.

In some embodiments, a buried gate insulation layer 112 (See FIG. 6) may be formed between the buried floating gate BFG and a sidewall of the trench region 102. The control gate electrode CG crosses over the floating gate FG and the buried floating gate BFG. The intergate dielectric IGD is also between the control gate electrode CG and the buried floating gate BFG. The floating gate FG and the buried floating gate BFG are electrically insulated from the control gate electrode CG by the intergate dielectric IGD. The tunnel insulation layer 103 is configured to allow FN tunneling during a write operation. The buried gate insulation layer 112 between the buried floating gate BFG and the sidewall of the trench region 102 is preferably thicker than the tunnel insulation layer 103 to prevent FN tunneling through the buried gate insulation layer 112 during a write operation.

In a cell array of the memory device, the device isolation layer STI defines a plurality of active regions of the substrate 100, and the control gate electrodes CG crosses over the device isolation layer and the active regions. The floating gates FG are between the control gate electrode CG and the active regions. The control gate electrodes CG also cross over the buried floating gates BFG in the recess region 110 of the device isolation layer STI. Buried floating gates BFG under one of the control gate electrodes CG are isolated from buried floating gates BFG under an adjacent other one of the control gate electrodes CG. Consequently, a voltage applied to selected control gate electrode CG is applied to a corresponding group of the buried floating gates BFG thereunder.

A channel of a flat transistor is formed in an active region below the floating gate FG, and a channel of a sidewall transistor is formed along a sidewall of the buried floating gate BFG. During a write operation, charges are injected from the channel of the flat transistor to the floating gate FG. Through an electric field applied to the channel of the sidewall transistor by a voltage coupled to the buried gate insulation layer between the buried floating gate BFG and a sidewall of the trench region 102, FN tunneling occurs more actively along the edge of the channel of the flat transistor. As a result, the speed of the write operation may be increased by the use of the buried floating gate BFG below the control gate electrode CG adjacent to the floating gate FG.

A threshold voltage of the flat transistor fluctuates responsive to the whether a logical value "0" or "1" is stored in the flat transistor (i.e., amount of charge on the floating gate FG). In contrast, a threshold voltage of the sidewall transistor may remain constant independent of the logical value stored in the flat transistor. Therefore, when the sidewall transistor is turned on by a voltage applied to the control gate electrode CG during a write operation, the cell current from the associated flat transistor may increase.

During a write operation of a NAND type nonvolatile memory device, a read voltage is applied to a selected word line WL and a pass voltage is applied to an unselected word line WL. For example, a read voltage of 0V can be applied to a selected word line WL and a pass voltage of 4.5V can be applied to an unselected word line WL. A bit line BL current can increase with an increase in the current from an unselected memory cell to which a pass voltage is applied in a selected cell array. The increased bit line BL current can facilitate writing a logical value "1" to the select memory cell. Because current can be cut-off at a selected memory cell when a logical value "0" is written in a selected memory cell, the sidewall transistor of an unselected memory cell may be either turned on or off. When the nonvolatile memory device in accordance with some embodiments of the present invention is used in a multi-bit memory cell, the multi-bit memory cell may exhibit an increased a verify window width for multiple bits because of an increased difference in the current for logical data "00" and logical data "11".

A method of fabricating a nonvolatile memory device according to first embodiments of the present invention will now be described with reference to FIGS. 4A-C and FIGS. 7A-C. FIGS. 4B and 7B are cross-sectional views taken along lines I-I' of FIGS. 4A and 7A, respectively. FIGS. 4C and 7C are cross-sectional views taken along lines II-II' of FIGS. 4A and 7A, respectively.

Figure 4A:
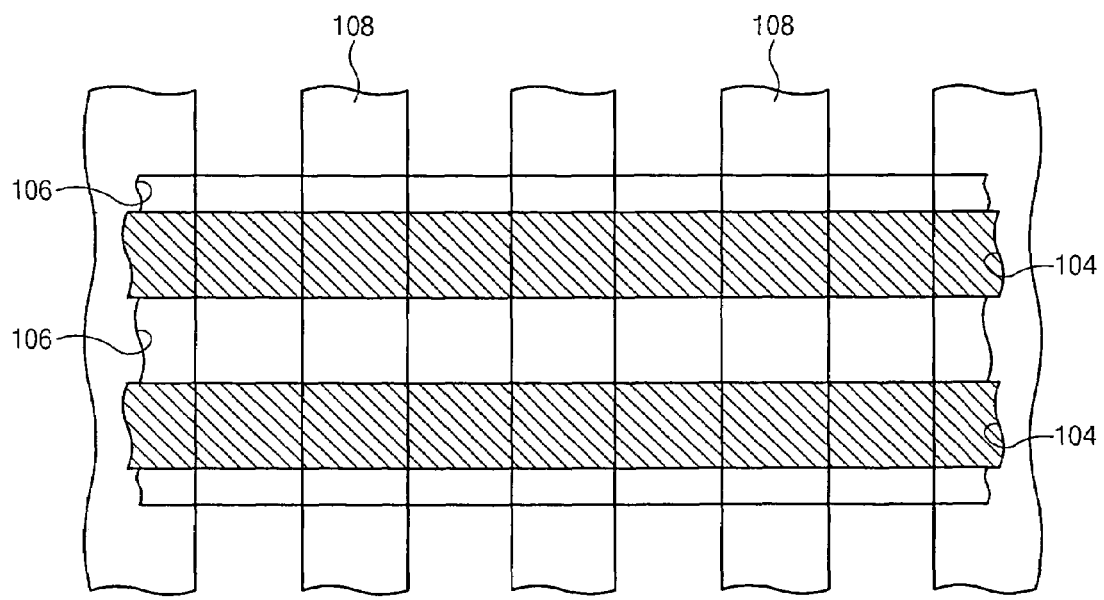
Figure 4B:
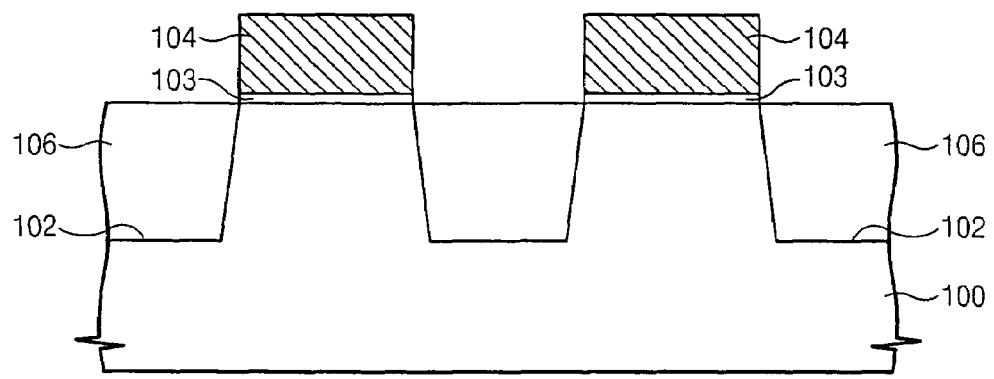
Figure 4C:
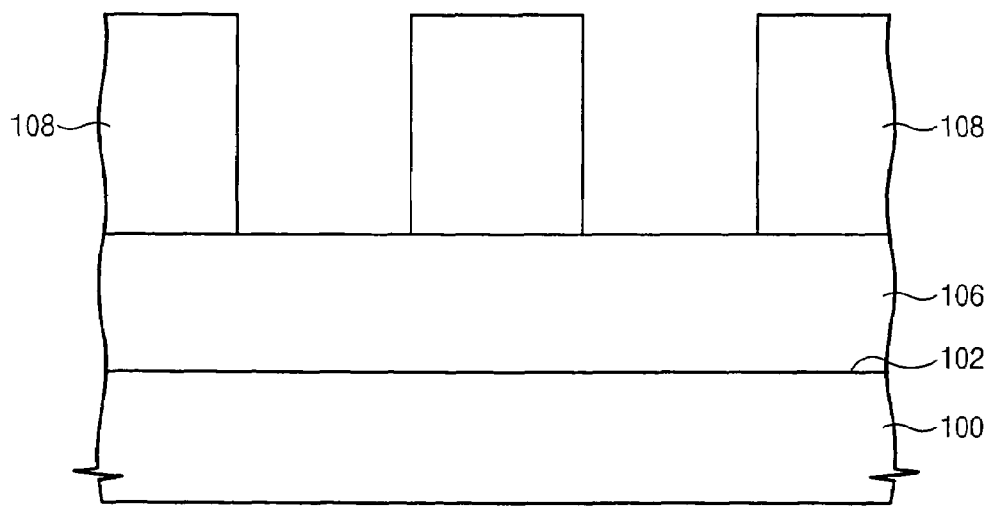

As illustrated in FIGS. 4A-C, an insulation layer, a conductive layer, and a mask layer are formed on a semiconductor substrate 100. The mask layer, the conductive layer, and the insulation layer are successively patterned to form trenches 102 in the substrate 100. The tunnel insulation layer 103 and floating gates 104 are formed on an active region of the substrate 100 between the trenches 102. The trenches 102 are filled with an insulation layer to form a device isolation layer 106. The mask layer is removed to expose the floating gates 104. A photoresist layer is formed on an entire surface of the substrate 100 where the floating gates 104 are exposed. The photoresist layer is patterned to form a photoresist pattern 108 that crosses over the floating gates 104 and the device isolation layer 106.

Figure 5A:
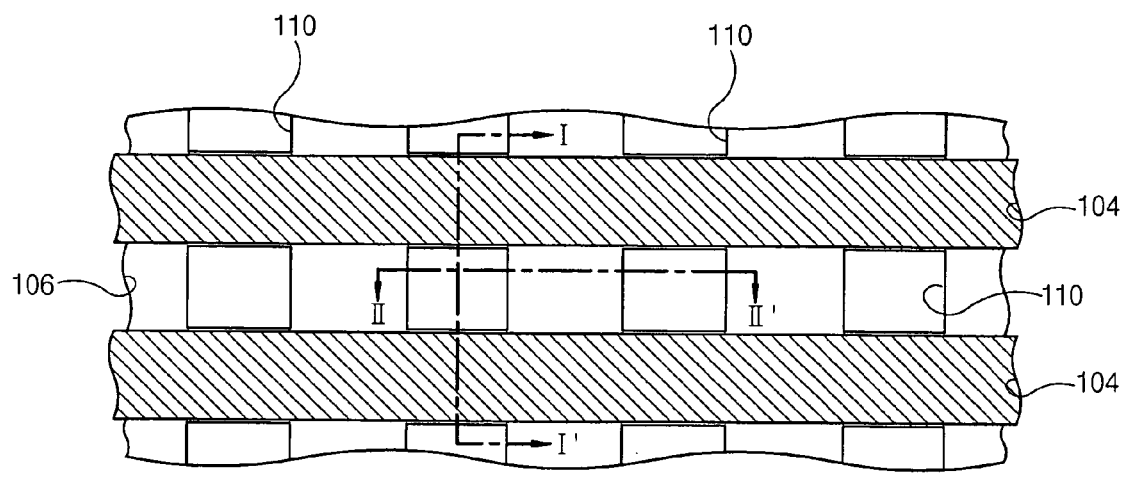
Figure 5B:
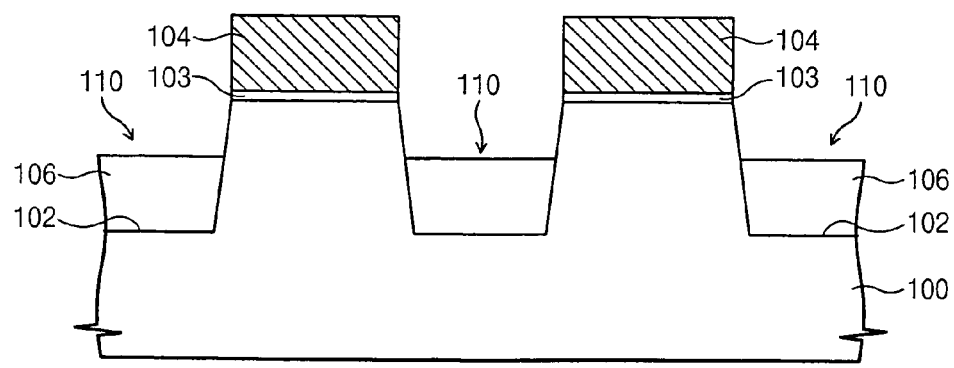
Figure 5C:
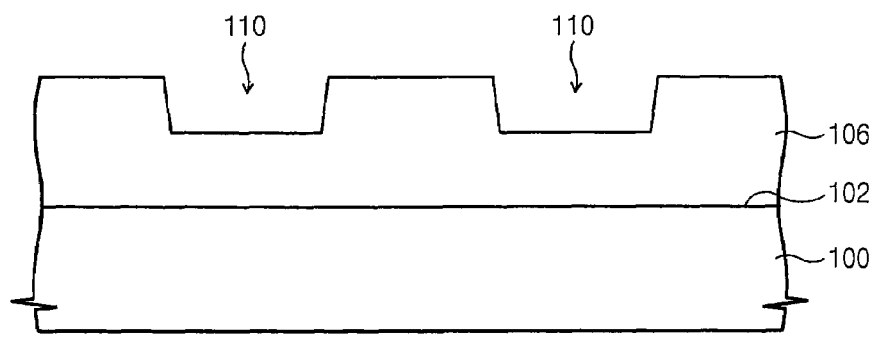

As illustrated in FIGS. 5A-C, using the photoresist pattern 108 as an etch mask, the device isolation layer 106 is partially removed to form recessed regions 110 therein and to expose a sidewall of the trenches 102 in the substrate 100. The recessed regions 110 may be arranged in a matrix.

Figure 6A:
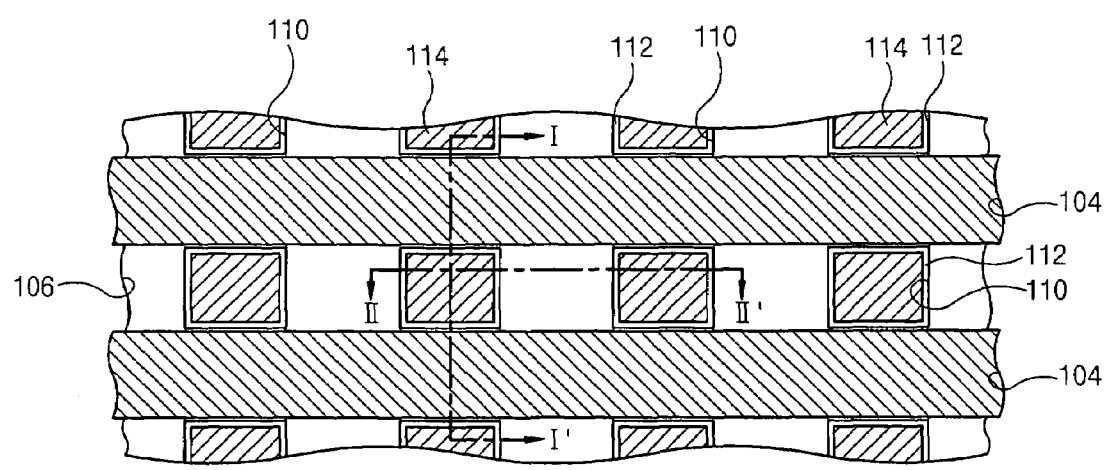
Figure 6B:
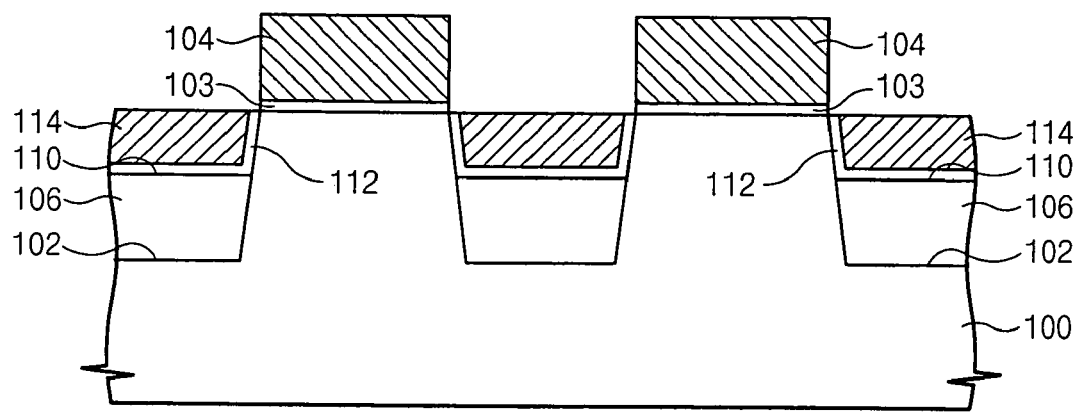
Figure 6C:
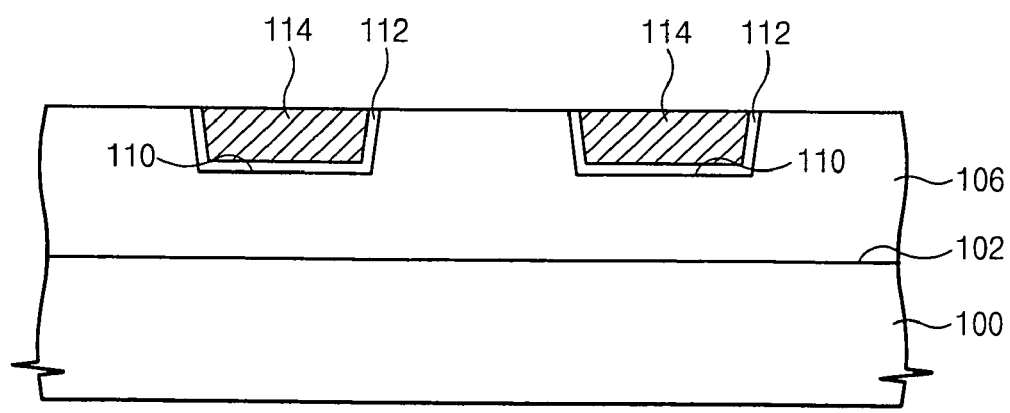

As illustrated in FIGS. 6A-C, a buried gate insulation layer 112 is formed in the recessed regions 110 of the device isolation layer 106 and is formed on the sidewalls of the trenches 102 in the substrate 100 which are exposed in the recessed regions 110. The recessed regions 110 are filled with a conductive layer to form a buried floating gate 114. Formation of the buried gate insulation layer 112 and the buried floating gates 114 is further described below.

The buried gate insulation layer 112 may be formed from a gate insulation layer having a defined thickness that is formed on the surface of the substrate 100, including within the recessed regions 110. The gate insulation layer covers at least a portion of a sidewall of the semiconductor 100 in the trenches 102 and can cover the floating gate pattern 104. The gate insulation layer is thicker than the tunnel insulation layer 103. Preferably, the gate insulation layer has a thickness that is sufficient to suppress FN tunneling therethrough. The gate insulation layer may be formed from a thermal oxide. When the gate insulation layer is a thermal oxide, a buried gate insulation layer may not be formed between the device isolation layer 106 and the buried floating gate 114. Alternatively, or additionally, the gate insulation layer may be formed by a chemical vapor deposition (CVD), and the buried gate insulation layer 112 can be formed between the buried floating gate 114 and the device isolation layer 106.

Formation of the buried floating gates 114 can include forming a conductive layer on the substrate 100 and within the recessed regions 110. The conductive layer is recessed to form the buried floating gate 114 within the recessed regions 110. The gate insulation layer covering the floating gates 104 is removed, leaving the buried gate insulation layer 112 between the buried floating gate 114 and the sidewalls of the trenches 102 in the substrate 100 and the device isolation layer 106.

Figure 7A:
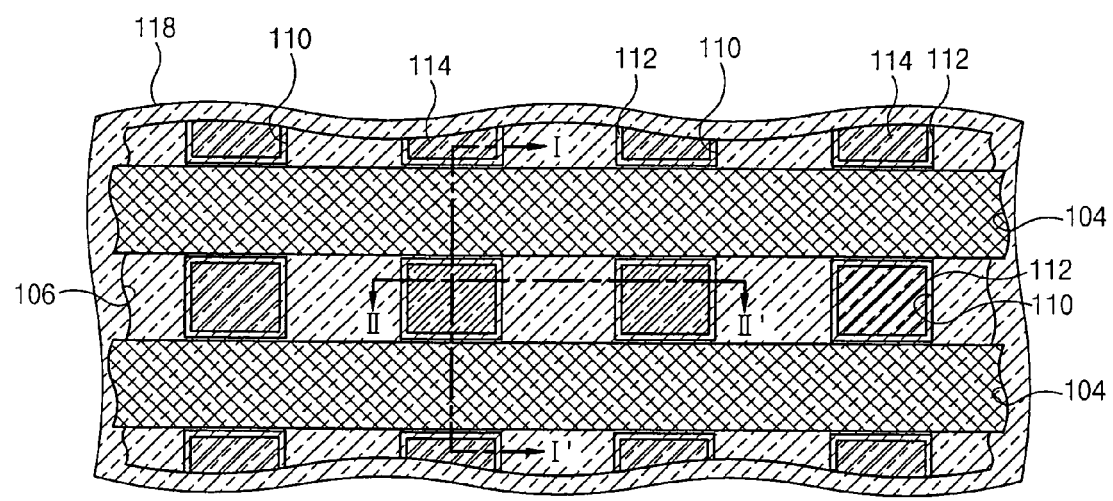
Figure 7B:
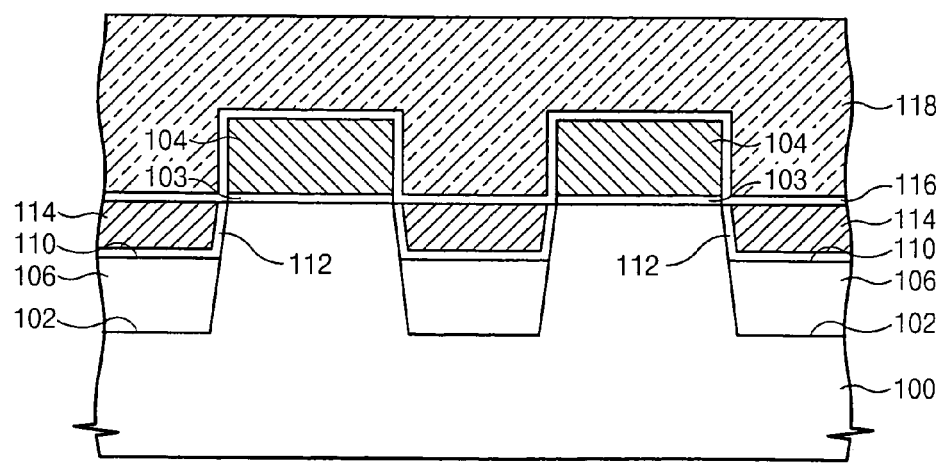
Figure 7C:
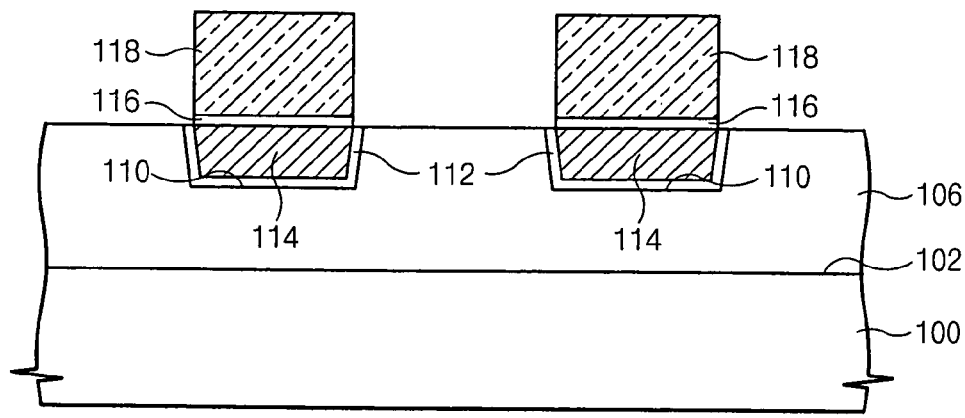

With reference to FIGS. 7A-C, a dielectric film 116 is conformally formed on the surface of the substrate 100. A control gate conductive layer 118 is formed on the dielectric film 116. The control gate conductive layer 118, the dielectric film 116, and the floating gates 104 are successively patterned to respectively form the control gate electrode CG, the intergate dielectric IGD, and the floating gates FG illustrated in FIGS. 3A-C. The control gate electrode CG crosses over the active regions of the substrate 100 and the device isolation layer 106. The floating gates FG are between the control gate electrode CG and the substrate 100. The intergate dielectric IGD is between the floating gate FG and the control gate electrode CG and between the buried floating gate BFG and the control gate electrode CG.

Methods of fabricating a nonvolatile memory device according to second embodiments of the present invention will now be described with reference to FIGS. 8A-C and FIGS. 9A-C. FIG. 8B and FIG. 9B are cross-sectional views taken along lines I-I' of FIG. 8A and FIG. 9A, respectively. FIG. 8C and FIG. 9C are cross-sectional views taken along lines II-II' of FIG. 8A and FIG. 9A, respectively.

Figure 8A:
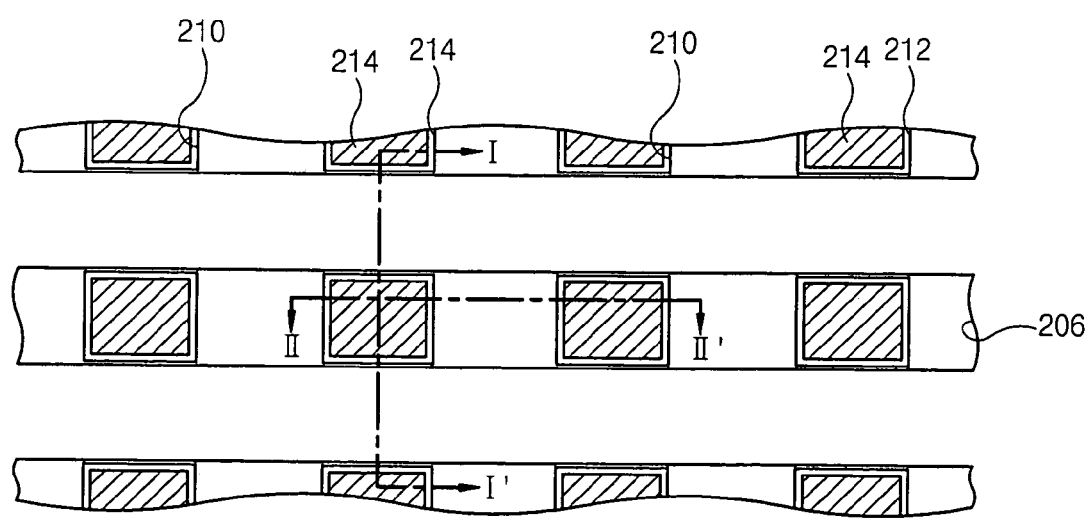
Figure 8B:
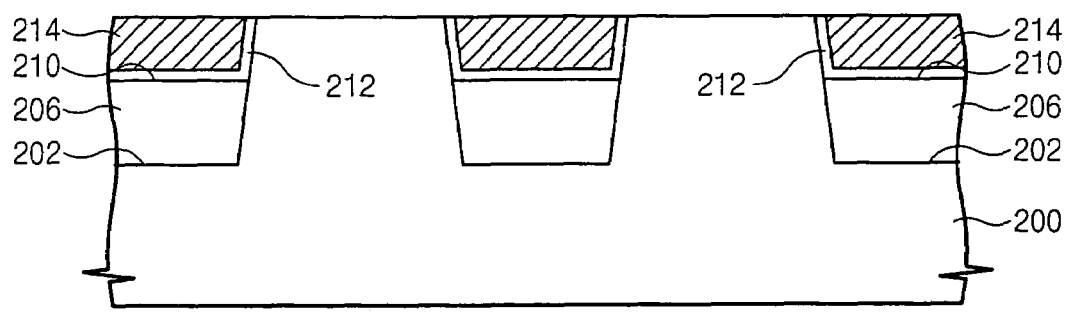
FIG. 8B and FIG. 9B are cross-sectional views taken along lines I-I' of FIG. 8A and FIG. 9A, respectively.
Figure 8C:
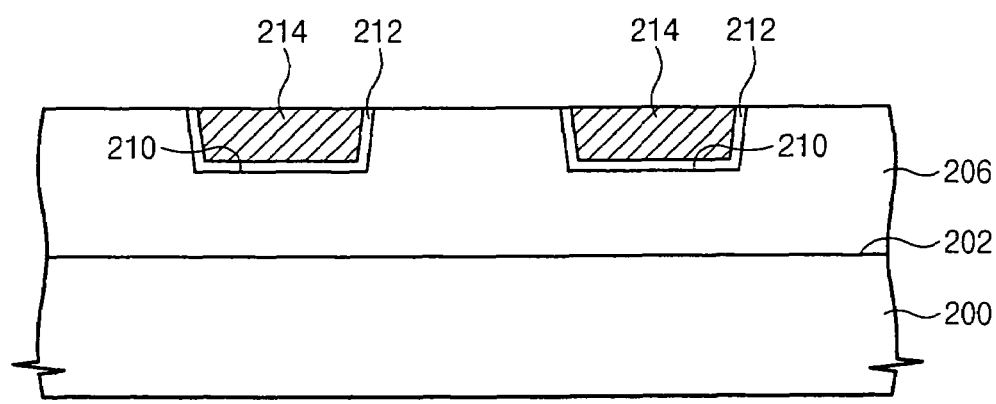
FIG. 8C and FIG. 9C are cross-sectional views taken along lines II-II' of FIG. 8A and FIG. 9A, respectively.

As illustrated in FIGS. 8A-C, a semiconductor substrate 200 is etched to form trenches 202, and active regions of the substrate 200 are defined between the trenches 202. The trenches 202 are filled with an insulation layer to form a device isolation layer 206. The device isolation layer 206 is partially removed to form a recessed regions 210 therein and to expose a sidewall of the trenches 202 in the substrate 200. The recessed regions 210 may be arranged in a matrix. A gate insulation layer is conformally formed on an entire surface of the recessed regions 210. A buried floating gate 214 is formed on the gate insulation layer in the recessed regions 210 and on the sidewalls of the substrate 100 exposed in the recessed regions 210. The gate insulation layer on the active region of the substrate 100 is removed to form a buried gate insulation layer 212 that remains between the buried floating gate 214 and a portion of the sidewalls of the substrate 100 in the recessed regions 210.

As illustrated, a plurality of buried floating gates 214 may be formed in the recessed regions 210 adjacent to the active regions of the substrate 100. The buried gate insulation layer 212 is between the buried floating gate 214 and the sidewalls of the trench region 202. The buried gate insulation layer 212 may be formed using the one or more of the processes described above with regard to FIGS. 7A-C (e.g., thermal oxidation or CVD). The buried gate insulation layer 212 may be between the buried floating gates 214 and the device isolation layer 206. Preferably, the buried gate insulation layer 212 has a thickness that is sufficient to suppress FN tunneling therethrough.

Figure 9A:
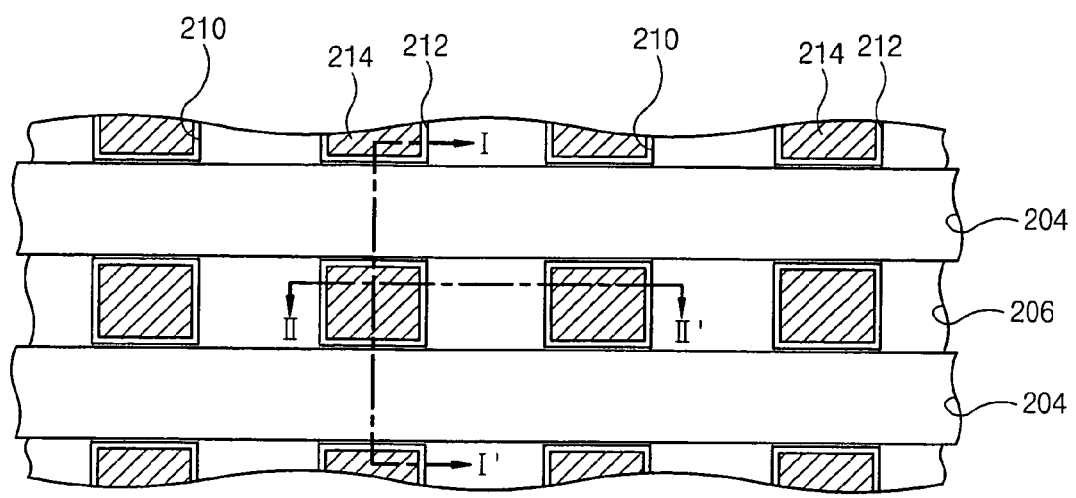
Figure 9B:
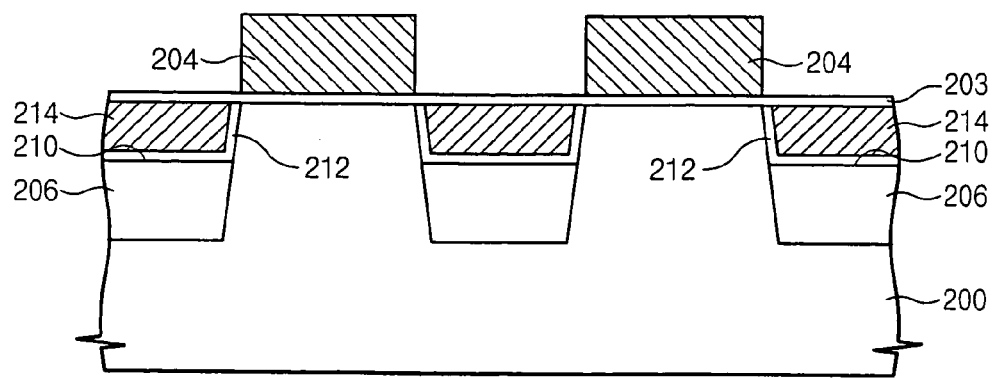
Figure 9C:
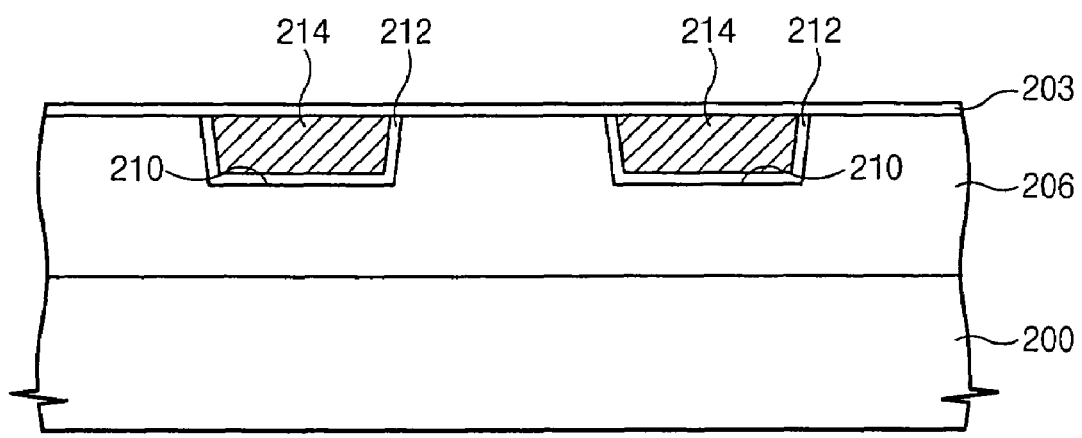

As illustrated in FIG. 9A-C, a tunnel insulation layer 203 is formed on an entire surface of the substrate 200. When the tunnel insulation layer 203 is formed from a thermal oxide, a tunnel insulation layer 203 is formed on the active regions of the substrate 100 and on the buried floating gates 214. The buried floating gate 214 may thereby be surrounded along its length by the tunnel insulation layer 203 and the buried gate insulation layer 212. A conductive layer is formed on an entire surface of the tunnel insulation layer. The conductive layer is patterned to form the floating gates 204 over the active regions of the substrate 100.

A dielectric film and a control gate conductive layer are formed on the floating gates 204. The dielectric film, the control gate conductive layer, and the floating gates 204 are patterned to respectively form the intergate dielectric IGD, the control gate electrode CG and the floating gates FG. The control gate electrode CG crosses over the active regions of the substrate 100 and the device isolation layer 106. The floating gates FG are between the control gate electrode CG and the substrate 100. The intergate dielectric IGD is between the floating gates FG and the control gate electrode CG and between the buried floating gate BFG and the control gate electrode CG, for example, as shown in FIGS. 3A-C. Following formation of the floating gates 204, the insulation layer on the buried floating gates 214 may be removed.

Accordingly, in some embodiments a nonvolatile memory device includes a floating gate, a tunnel insulation layer, a control gate electrode, buried gate insulation layer, and a buried floating gate. The buried floating gate is on the device isolation layer adjacent to the floating gate. Accordingly, a flat transistor formed from the stacked floating gate, tunnel insulating layer, and active region of the substrate can be controlled by a voltage applied to the control gate electrode. A sidewall transistor is formed from the stacked buried floating gate, buried gate insulation layer, and active region of the substrate and can be controlled by the voltage applied to the control gate electrode.

As explained above, an electric field along the edge of a channel of a selected memory cell may be strengthened during a write operation, which may enhance the efficiency FN tunneling that occurs during a write operation. Moreover, a channel voltage of an unselected memory cell may be caused to increase, which may suppress erroneous writing thereto. Also during a write operation, the sidewall transistor may be turned on to increase the cell current. As a result, the nonvolatile memory device may operate at higher speeds, and may allow verification of multiple bits in memory cells because the difference between the cell current that represents logical values "0" and "1" is increased.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be within the scope of the invention as defined in the appended claims.

What is claimed is:

1. A nonvolatile memory device comprising:
    a semiconductor substrate with a trench therein that defines an active region of the substrate adjacent to the trench;
    a device isolation layer on the substrate along the trench;
    a tunnel insulation layer on the active region of the substrate;
    a floating gate on the tunnel insulation layer opposite to the active region of the substrate;
    a buried floating gate on the device isolation layer in the trench;
    an intergate dielectric layer extending across and directly on the floating gate and the buried floating gate; and
    a control gate directly on the intergate dielectric layer and extending across the floating gate and the buried floating gate.

2. The nonvolatile memory device of claim 1, wherein a lower major surface of the floating gate is above an upper major surface of the buried floating gate.

3. The nonvolatile memory device of claim 2, wherein the upper major surface of the buried floating gate is aligned with an upper major surface of the active region of the substrate.

4. The nonvolatile memory device of claim 1, further comprising a buried gate insulation layer between the buried floating gate and a sidewall of the substrate along the trench.

5. The nonvolatile memory device of claim 4, wherein:
    the buried floating gate is directly on the buried gate insulation layer; and
    the buried gate insulation layer is directly on the device isolation layer and the sidewall of the substrate along the trench.

6. The nonvolatile memory device of claim 4, wherein the buried gate insulation layer is thicker than the tunnel insulation layer.

7. The nonvolatile memory device of claim 1, wherein:
    a central region of the device isolation layer in the trench has an upper major surface that is recessed below an upper major surface of a surrounding region of the device isolation layer in the trench; and
    the buried floating gate is disposed in the recessed central region of device isolation layer so that the surrounding region of the device isolation layer is between the buried floating gate and a sidewall of the semiconductor in the trench.

8. The nonvolatile memory device of claim 1, wherein the floating gate and the buried floating gate are electrically insulated from each other.

9. A nonvolatile memory device comprising:
    a semiconductor substrate;
    trenches in the substrate that define active regions therebetween;
    a tunnel insulation layer on the active regions of the substrate;
    a plurality of floating gates each on the tunnel insulation layer over the active regions of the substrate;
    a buried gate insulation layer on the substrate along the trenches;
    a plurality of buried floating gates each in one of the trenches on the buried gate insulation layer and adjacent to one of the floating gates, wherein the buried gate insulation layer is between the buried floating gates and sidewalls of the trenches;
    an intergate dielectric layer extending across and directly on the floating gates and the buried floating gates; and
    a control gate directly on the intergate dielectric layer and extending across the floating gates and the buried floating gates.

10. The nonvolatile memory device of claim 9, wherein the buried floating gates are electrically insulated from adjacent floating gate patterns.

11. The nonvolatile memory device of claim 9, wherein lower major surfaces of the floating gates are above adjacent upper major surfaces of the buried floating gates.

12. The nonvolatile memory device of claim 11, wherein the upper major surfaces of the buried floating gates are aligned with adjacent upper major surfaces of the active regions of the substrate.

13. The nonvolatile memory device of claim 9, further comprising a device isolation layer between the buried gate insulation layer and the semiconductor along a bottom portion of the trench, and wherein:
    a central region of the device isolation layer in the trenches has an upper major surface that is recessed below an upper major surface of a surrounding region of the device isolation layer in the trenches; and
    the buried floating gates are on the buried gate insulation layer disposed in the recessed central region of device isolation layer in the trenches.

14. The nonvolatile memory device of claim 13, wherein the buried gate insulation layer is thicker than the tunnel insulation layer.

15. The nonvolatile memory device of claim 9, wherein the buried floating gates are electrically insulated from the adjacent floating gates.

16. A method of fabricating a nonvolatile memory device, the method comprising:
    forming a trench in a semiconductor substrate that defines an active region of the substrate adjacent to the trench;
    forming a tunnel insulation layer on the active region of the substrate;
    forming a floating gate on the tunnel insulation layer opposite to the active region of the substrate;
    forming a device isolation layer on the substrate along the trench;
    forming a buried floating gate on the device isolation layer in the trench;
    forming an intergate dielectric layer extending across and directly on the floating gate and the buried floating gate; and
    forming a control gate directly on the intergate dielectric layer and extending across the floating gate and the buried floating gate.

17. The method of claim 16, further comprising recessing a central region of the device isolation layer in the trench so that an upper major surface of the recessed central region is below an upper major surface of a surrounding region of the device isolation layer in the trench, wherein the buried floating gate is formed in the recessed central region of the device isolation layer so that the surrounding region of the device isolation layer is between the buried floating gate and a sidewall of the semiconductor along the trench.

18. The method of claim 16, further comprising forming a buried gate insulation layer on a sidewall of the substrate along the trench from a different material than the device isolation layer, wherein the buried floating gate is formed on the buried gate insulation layer in the trench so that the buried gate insulation layer is between the buried floating gate and the sidewall of the substrate along the trench.

19. The method of claim 18, wherein forming the buried gate insulation layer comprises:

forming an insulation layer on the floating gate and a sidewall of the substrate along the trench; and removing the insulation layer on the floating gate while leaving the insulation layer on the sidewall of the substrate along the trench.

20. The method of claim 16, wherein the tunnel insulation layer is formed on the active region of the substrate and the buried floating gate before the floating gate is formed on the tunnel insulation layer.

* * * * *